(12) United States Patent
Akiyama et al.

(10) Patent No.: US 10,256,331 B2
(45) Date of Patent: Apr. 9, 2019

(54) INSULATED GATE TURN-OFF DEVICE HAVING LOW CAPACITANCE AND LOW SATURATION CURRENT

(71) Applicant: Pakal Technologies, LLC, San Francisco, CA (US)

(72) Inventors: Hidenori Akiyama, Miyagi (JP); Richard A. Blanchard, Los Altos, CA (US); Woytek Tworzydlo, Austin, TX (US); Vladimir Rodov, Seattle, WA (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 15/910,482

(22) Filed: Mar. 2, 2018

(65) Prior Publication Data

US 2018/0254336 A1   Sep. 6, 2018

Related U.S. Application Data

(60) Provisional application No. 62/466,580, filed on Mar. 3, 2017.

(51) Int. Cl.
*H01L 29/732* (2006.01)
*H01L 29/745* (2006.01)
(Continued)

(52) U.S. Cl.
CPC ...... *H01L 29/7455* (2013.01); *H01L 29/0623* (2013.01); *H01L 29/0696* (2013.01);
(Continued)

(58) Field of Classification Search
CPC .......... H01L 29/66363; H01L 29/7397; H01L 29/66303
(Continued)

(56) References Cited

U.S. PATENT DOCUMENTS 5,828,100 A * 10/1998 Tamba ................ H01L 29/1095
257/328
7,705,368 B2   4/2010 Rodov et al.
(Continued)

OTHER PUBLICATIONS

Tian Xiaoli et al., "A novel optimization design for 3.3 kV injection-enhanced gate transistor", Journal of Semiconductors, Jan. 2014, pp. 014005-1 to 014005-5, vol. 35, No. 1, 5 pages.
(Continued)

*Primary Examiner* — George Fourson, III
(74) *Attorney, Agent, or Firm* — Patent Law Group LLP; Brian D. Ogonowsky (57) ABSTRACT

An insulated gate turn-off (IGTO) device, formed as a die, has a layered structure including a P+ layer (e.g., a substrate), an N− epi layer, a P-well, vertical insulated gates formed in the P-well, and N+ regions between at least some of the gates, so that vertical NPN and PNP transistors are formed. A source/emitter electrode is on top, and a drain/cathode electrode is on the bottom of the substrate. The device is formed of a matrix of cells. To turn the device on, a positive voltage is applied to the gates, referenced to the source/emitter electrode. Some of the cells are passive, having gates that are either not connected to the active gates or having gates that are shorted to their associated N+ regions, to customize the input capacitance and lower the saturation current. Other techniques are described to form the passive cells.

20 Claims, 9 Drawing Sheets

(51) Int. Cl.
*H01L 29/06* (2006.01)
*H01L 29/66* (2006.01)
*H01L 29/739* (2006.01)

(52) U.S. Cl.
CPC .. *H01L 29/66303* (2013.01); *H01L 29/66363* (2013.01); *H01L 29/7397* (2013.01)

(58) Field of Classification Search
USPC ........................................................ 257/566
See application file for complete search history.

(56) References Cited

U.S. PATENT DOCUMENTS

| | | | | |
|---|---|---|---|---|
| 2008/0315249 | A1* | 12/2008 | Minato | H01L 29/407 |
| | | | | 257/139 |
| 2013/0037853 | A1* | 2/2013 | Onozawa | H01L 29/0661 |
| | | | | 257/139 |
| 2016/0268181 | A1* | 9/2016 | Yasuhara | H01L 29/51 |
| 2017/0077004 | A1* | 3/2017 | Onozawa | H01L 29/407 |
| 2017/0162458 | A1* | 6/2017 | Onozawa | H01L 22/30 |
| 2017/0162662 | A1* | 6/2017 | Naito | H01L 23/528 |
| 2018/0108738 | A1* | 4/2018 | Naito | H01L 29/1095 |
| 2018/0204909 | A1* | 7/2018 | Konishi | H01L 29/739 |
| 2018/0323294 | A1* | 11/2018 | Okuda | H01L 29/7397 |

OTHER PUBLICATIONS

Gejo et al., "Ideal Carrier Profile Control for High-Speed Switching of 1200 V IGBTs", Proceedings of the 26th International Symposium on Power Semiconductor Devices & IC's, Jun. 15-19, 2014, pp. 99 to 102, 4 pages.

Ohi et al., "Ultra Low Miller Capacitance Trench-Gate IGBT with the Split Gate Structure", Proceedings of the 27th International Symposium on Power Semiconductor Devices & IC's, May 10-14, 2015, pp. 25-28, 4 pages.

* cited by examiner

INSULATED GATE TURN-OFF DEVICE HAVING LOW CAPACITANCE AND LOW SATURATION CURRENT

CROSS-REFERENCE TO RELATED APPLICATIONS

This application is based on provisional application Ser. No. 62/466,580, filed Mar. 3, 2017, by Richard A. Blanchard et al., assigned to the present assignee and incorporated herein by reference.

FIELD OF THE INVENTION

This invention relates to insulated gate turn-off devices (an IGTO) and, more particularly, to an IGTO that has a lower capacitance for rapid switching.

BACKGROUND

U.S. Pat. No. 7,705,368 and Japanese Patent 4,284,689 (having inventors in common with the present inventors) disclose an efficient MOS-gated power switching device referred to as an insulated gate turn off device or an "IGTO" with both high current density and low ON voltage. U.S. Pat. No. 7,705,368 is incorporated herein by reference at least for its process description and description of the method of operation of the IGTO.

Figure 1:
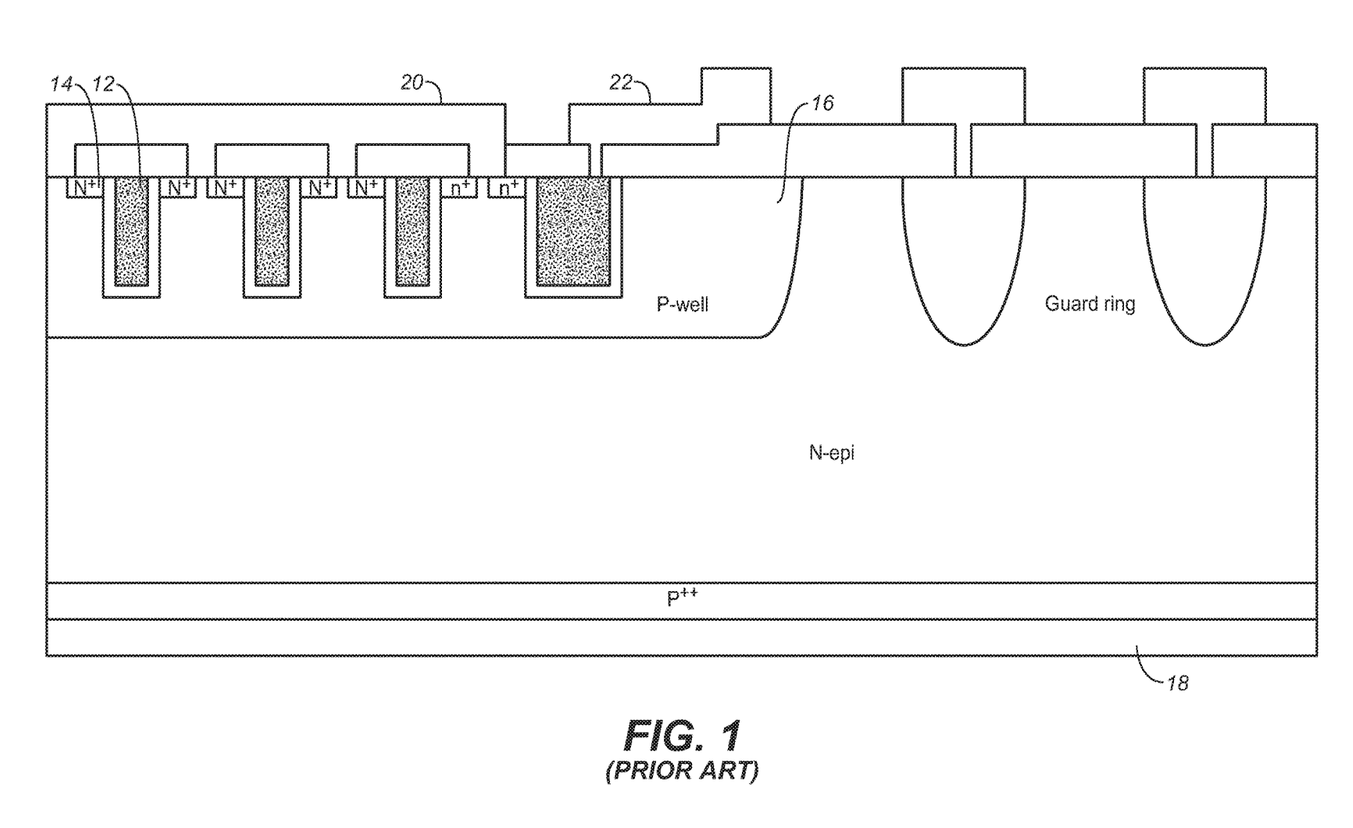
FIG. 1 is a cross-sectional view of a portion of a prior art IGTO of the inventors' own design.
Figure 2:
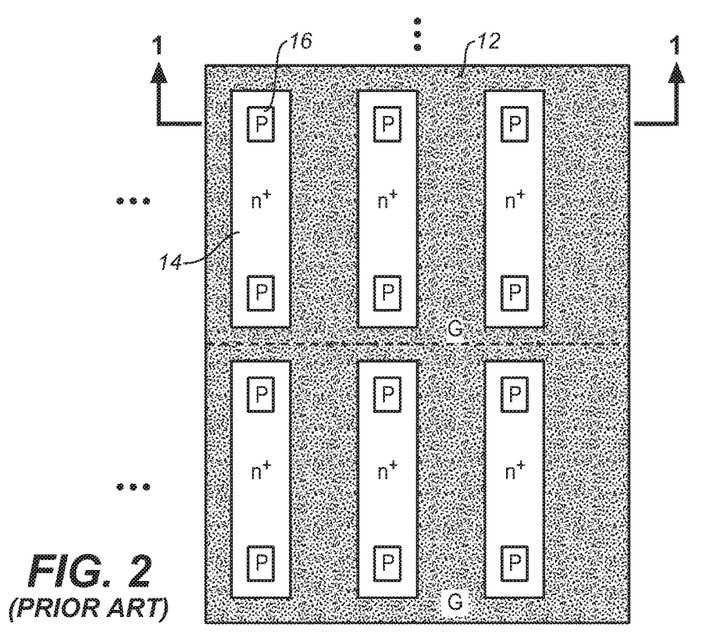
FIG. 2 is a top down view of the gate mesh design that is used in the IGTO of FIG. 1.

A cross-section of a portion of the IGTO of the '368 patent is shown in FIG. 1, while a top view of the gate area is shown in FIG. 2. FIG. 1 is a cross-section along line 1-1 in FIG. 2.

The conductive gate 12 of the IGTO is formed in a trench that has a "rectangular mesh" structure (FIG. 2) which surrounds the N+ emitter/source 14 and portions of the P− base/body 16 of the bipolar MOS transistor. The P− base/body 16 is also referred to as a P-well. A forward voltage is applied between the metal drain electrode 18 and the metal source electrode 20. In one application, a load may be connected between the source electrode 20 and ground. A gate electrode 22 is used to bias the vertical gates 12. All the gates 12 are electrically connected together outside the field of FIG. 1. When the gates 12 are suitably positively biased, the effective base width of the vertical NPN transistor is reduced, increasing its beta, causing the product of the betas of the vertical NPN and PNP transistors to be greater than one, resulting in regenerative action. As a result, current flows between the source and drain electrodes with a low ON voltage.

In these cells, which are referred to as "active cells," current flows vertically through the separate rectangular regions of the IGTO that are surrounded by the vertical gates 12. The individual rectangular regions conduct current in parallel, resulting in a device that has a low ON voltage and is able to conduct high current. However, the IGTO structure shown in FIGS. 1 and 2 has a relatively high capacitance, which impacts both switching speed and power dissipation. In addition, this structure has high saturation current, which is a disadvantage in some applications.

The capacitance between the gate (at one voltage) and the adjacent N+ source/P-body (at another voltage) is relatively high since the gate and source/body are separated by a thin gate oxide, and there is a relatively large "plate" area. The capacitance between the gate and the drain electrode is low due to their large separation.

In some applications, the customer requires a low input capacitance and/or a low saturation current.

What is needed is an improved IGTO with a lower capacitance and lower saturation current. A lower capacitance enables more rapid switching. Saturation current, in this context, means that the IGTO self-limits its current, typically to a level above the normal load current. Therefore, the IGTO may advantageously self-limit its current even if the load fails and becomes a short circuit. In an example, a low saturation current may provide the time needed for a driver circuit to sense an over-current condition and reduce the current to an acceptable level, since a lower current results in lower power dissipation. Hence, relatively low saturation currents may be desirable. It is also desirable that the input capacitance and saturation current be customizable for a particular customer without adding steps to the fabrication process.

SUMMARY

In one embodiment, the present invention entails modifications to the inventors' previous IGTO structure that result in an IGTO having decreased capacitance, without a significant increase in ON voltage. This allows more rapid switching. In addition, these devices have a low saturation current, which is advantageous in certain applications to limit the current.

To reduce the capacitance, the relatively dense, contiguous gate mesh is modified to increase the pitch between gates, creating larger rectangular openings in the gate mesh. A separated gate, not connected to the gate mesh, is formed within the rectangular openings of the gate mesh. These separated gates are either connected to the source regions (and source electrode), or the source/emitter region is not formed in a passive cell, or the separated gate is floating.

If the separated gates are shorted to the source electrode, there is no voltage differential between the separated gates and effectively no capacitance. Since the separated gates do not invert the P-well, the cell containing the separated gate is a passive cell, as opposed to an active cell controlled by the gate mesh. By controlling the number of passive cells, the input capacitance of the IGTO can be precisely controlled. This added control is achieved without any additional masks or cost.

Similarly, if the separated gate is floating, resulting in a passive cell, it floats up to the source voltage so there is effectively no capacitance associated with the separated gate.

In another embodiment, a conventional mesh gate is formed with no separated gates. However, for the passive cells, the source/emitter mask is designed so that no source/emitter region is formed in passive cells, so there is no capacitance added by the gate for the passive cells. In this case, the body region in these passive cells is either connected to the source electrode or floating.

In all cases, there is no substantial effect on the ON voltage (forward voltage drop).

The reduction in the active cell area, to lower the input capacitance, also reduces the saturation current. This saturation current can be easily adjusted using masking to meet the requirements of the customer without affecting beneficial aspects of the IGTO. Additionally, to lower the saturation current, the gate oxide thickness of all the cells can be made thicker, which limits the effect of the gates on the current.

By retaining the conductive gates in the passive cells (rather than deleting them entirely in the passive areas), there is little or no adverse effect on the equi-potential curvature in the depletion region when the device is off, since the gate potential is relatively close to the source voltage. As a result, a high breakdown voltage is maintained.

Other modifications may also be used to reduce the capacitance. In one embodiment, portions of the gate mesh are removed, resulting in a lower density gate structure. The number and location of the removed gate mesh areas are selected so the device's breakdown voltage is not reduced by increasing the equi-potential curvature near the top of the device.

In all the embodiments, the basic structure of the IGTO is unchanged and the operation parameters relating to input capacitance and saturation current are customizable without adversely affecting other parameters of the IGTO to meet the customer's requirements.

The various techniques can be combined to reduce the input capacitance and/or lower the saturation current.

Other techniques are described.

BRIEF DESCRIPTION OF THE DRAWINGS

FIG. 1 is a cross-section along line 1-1 in FIG. 2.

Elements that are the same or equivalent are labeled with the same numbers.

DETAILED DESCRIPTION

The present disclosure describes an IGTO structure with a selectable input capacitance and saturation current while still retaining a low ON voltage. Various alternative IGTO structures are proposed and discussed.

Figure 3:
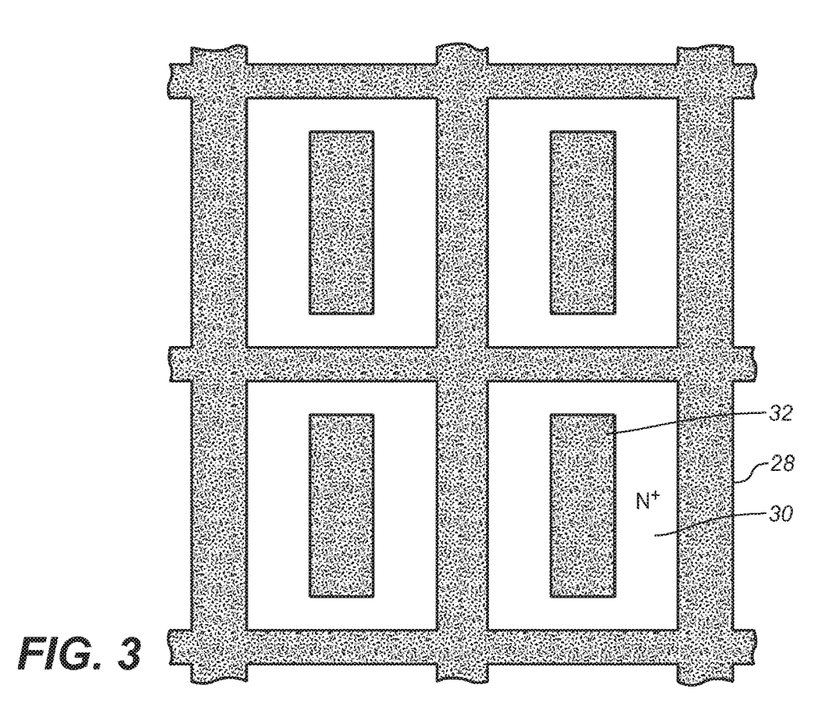
FIG. 3 is a top down view of a gate/trench configuration where areas of the gate/trench are electrically separated to form passive cells.

Type 1: IGTOs with Portions of their Gate Trench Electrically Isolated from the Active Gate Region In these versions of the IGTO, portions of the gate/trench region are physically separated from the remainder of the gate/trench as shown in FIG. 3. FIG. 3 is a modified version of the gate geometry of FIG. 2, but the device still has a gate structure with a rectangular mesh of gates 28. N+ emitter/source regions 30 are formed on the top surface of the silicon adjacent to the vertical gates 28.

The pitch of the mesh of gates 28 is greater in the "x" direction compared to that of FIG. 2, and there are small rectangular gate/trench regions 32 (hereinafter gates 32) within the mesh openings that are not physically or electrically connected to the remainder of the gates 28 in the mesh. These separated gates 32 may be configured in one of at least two ways. These ways include:

1. Electrically connect to the adjacent N+ source/emitter 30 or connect to both the N+ and P-type regions;
2. Not electrically connect to any region (i.e., floating).

Figure 4:
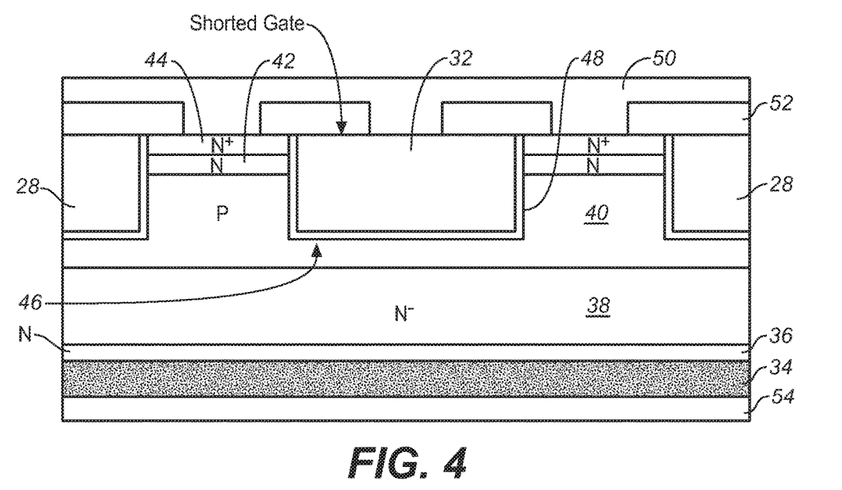
FIG. 4 is a cross-sectional view of a portion of an IGTO using the gate/trench configuration of FIG. 3 where the separated gates are connected to the source electrode.

In the first instance, which is referred to as the "shorted gate passive cell" configuration, the voltage between the gates 32 and their adjacent N+ and P-type regions is zero volts. This configuration is shown in FIG. 4. The absence of a differential voltage between the gate 32 and the adjacent semiconductor region means that there is no capacitance between these regions.

In FIG. 4, which is a cross-section of two cells, a P+ substrate 34 is used. Over the substrate 34 is formed an N-buffer layer 36, followed by a lighter doped N-layer 38 that serves as a drift layer to achieve the desired breakdown voltage. A P-well 40, or an epitaxial layer that is doped in-situ, is formed as a base of a vertical NPN transistor. An N-region 42, followed by a more highly doped N+ region 44 (acting as an emitter/source), are then implanted in the P-well 40.

Trenches 46 are then etched into the silicon, followed by forming a thin gate oxide 48 along the walls of the trenches 46. The trenches 46 are then filled with a conductive doped polysilicon to form the gates 28 and 32. The gates 28 are part of the mesh of FIG. 3 and are all electrically connected to a gate electrode, outside of the field of FIG. 4, but similar to the gate electrode 22 shown in FIG. 1. A bias voltage is applied to the gate electrode to turn on the IGTO.

The gate 32 is not connected to the other gates 28 but is electrically connected to the metal source electrode 50 at the top of the gate 32. The source electrode 50 may also be coupled to the P-well 40 to weakly bias the P-well 40 but still allow the N+ region 44 (emitter) in the active cells to become forward biased with respect to the P-well 40 (base) to turn on the NPN transistor.

A dielectric 52 insulates the source electrode 50 from certain top areas of the silicon.

A metal drain electrode 54 contacts the P+ substrate 34.

As mentioned with respect to FIG. 1, a forward voltage is applied between the metal drain electrode 54 and the metal source electrode 50. In one application, a load may be connected between the source electrode 50 and ground. When the gates 28 are suitably positively biased above a threshold voltage, via a gate electrode (not shown), the effective base width of the vertical NPN transistor is reduced, increasing its beta, causing the product of the betas of the vertical NPN and PNP transistors to be greater than one, resulting in regenerative action. As a result, current flows between the source and drain electrodes with a low ON voltage. The NPN transistor is formed by the N+ region 44, the P-well 40, and the N-layer 38, while the PNP transistor is formed by the P+ substrate 34 (emitter), N-layer 38, and the P-well 40.

The reduction in the active cell area, to lower the input capacitance, also limits the current that can be conducted by the IGTO when turned on. This saturation current can be easily adjusted using masking to meet the requirements of the customer with no additional cost.

Additionally, to lower the saturation current, the gate oxide thickness of all the cells can be made thicker, which limits the effect of the gates on the current. This change in structure surprisingly does not significantly increase the ON voltage (or forward voltage). For example, in a simulation of a single embodiment, saturation current was drastically reduced from 1200 A (at 200 V) to 300 A, while the forward voltage (tested at 20 A) was only increased from about 1.14 volts to 1.2 volts.

The current density in the active cells is exponentially increased as the ratio of passive cells to active cells is increased, since all load current must flow through the active cells. Increased current density increases the resistance and surprisingly results in a reduced negative temperature coefficient of the IGTO, which is desirable in certain applications.

Figure 5:
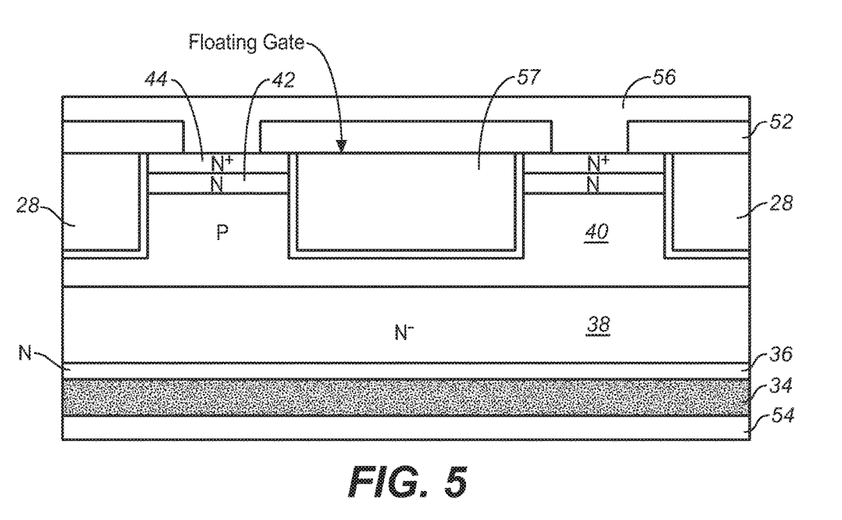
FIG. 5 is a cross-sectional view of a portion of an IGTO using the gate/trench configuration of FIG. 3 where the separated gates are electrically floating.

The second instance, which is referred to as the "floating gate passive cell," configuration, is shown in FIG. 5. Note that the source electrode 56 does not contact the floating gate 57. In this configuration, the voltage between the separated gate 57 and the nearby N+ region 44 and P-well 40 is unspecified. In an operating IGTO, this voltage will move to zero volts over a period of time. The resulting uncertainty in the value of this voltage makes the "floating gate passive cell" configuration generally undesirable in certain applications. All other aspects of the IGTO of FIG. 5 may be identical to FIG. 4.

Type 2: IGTOs without Source Regions Present in the Body Region between Trench Gates In the Type 2 IGTOs, all trench gates are connected together (in a mesh) and are driven by the gate voltage just as in the original IGTO structure. The gate mesh may resemble that of FIG. 2. However, this embodiment has no N+ region (source/emitter) formed in the passive cells. Therefore, there is no capacitance added by the gates in the passive cells. There are also two configurations of this version:

1. The body region between the gate trenches is electrically connected to the source electrode; or
2. The body region between the gate trenches is not electrically connected (i.e., floating).

Figure 6:
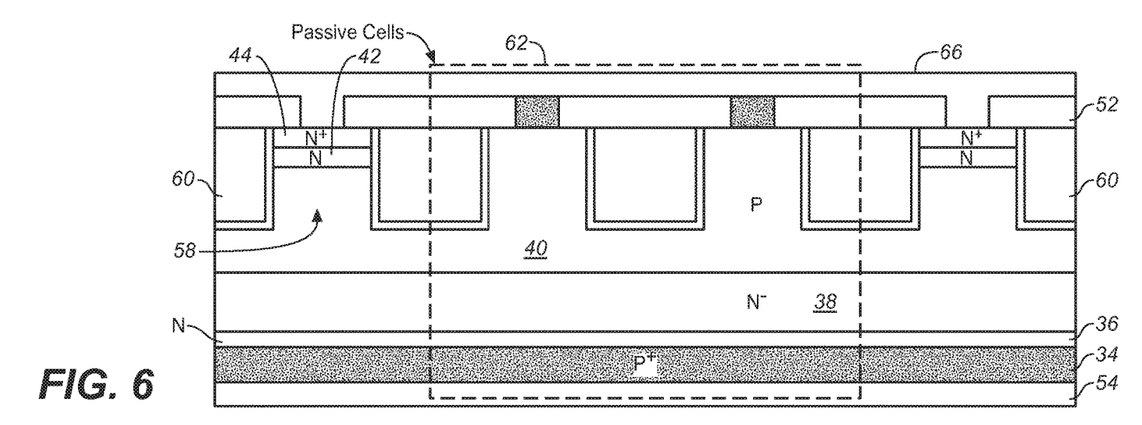
FIG. 6 is a cross-sectional view of a portion of an IGTO where the gates are all connected together but N+ sources/emitters are not formed in passive cells. The source electrode contacts the P-well (body region) in the passive cells.

The first Type 2 configuration, shown in FIG. 6, is referred to as the "shorted body passive cell." As seen in FIG. 6, the active cell 58 contains the N+ region 44, so the active cells 58 conduct current when the gate 60 is biased high. The passive cells 62 do not contain N+ regions 44 so do not conduct current. Since there is no N+ region next to the gates 60 in the passive cells 62 and the P-well 40 is lightly doped (a poor conductor), there is substantially no capacitance associated with the gates 60 in the passive cells 62. In the passive cells 62, the P-well 40 is in contact with the source electrode 66. Therefore, the input capacitance and the saturation current are easily customizable for a customer via mask designs with no additional cost.

Figure 7:
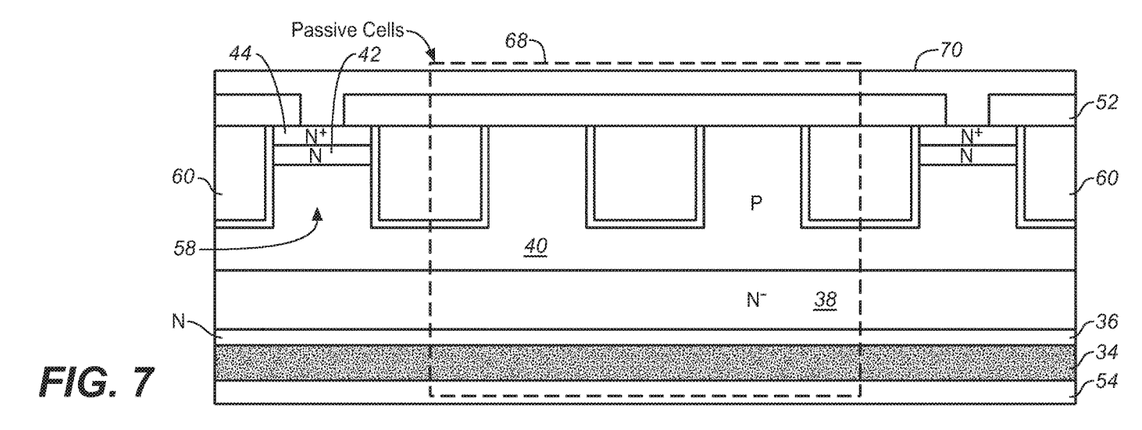
FIG. 7 is similar to FIG. 6 but the P-well in the passive cells is not connected to the source electrode.

The second Type 2 configuration, shown in FIG. 7, is called the "floating body passive cell." In this fourth version of the modified IGTO, high current is conducted through the active cells 58, since there is an N+ region 44 (source/emitter) present, but no current flows through the passive cells 68 which do not contain N+ regions 44. In contrast to FIG. 6, the source electrode 70 does not contact the P-well 40 (body region).

Type 3: IGTOs with Lower Gate Density that is Obtained by Removing Sections of the Gate In the Type 3 versions of the IGTO, no gates/trenches are formed in certain areas, which may create an asymmetric trench/gate structure. This is simply done using mask designs at no additional cost. As mentioned above, the resulting gate configuration should be chosen so there is no reduction in breakdown voltage.

Figure 8:
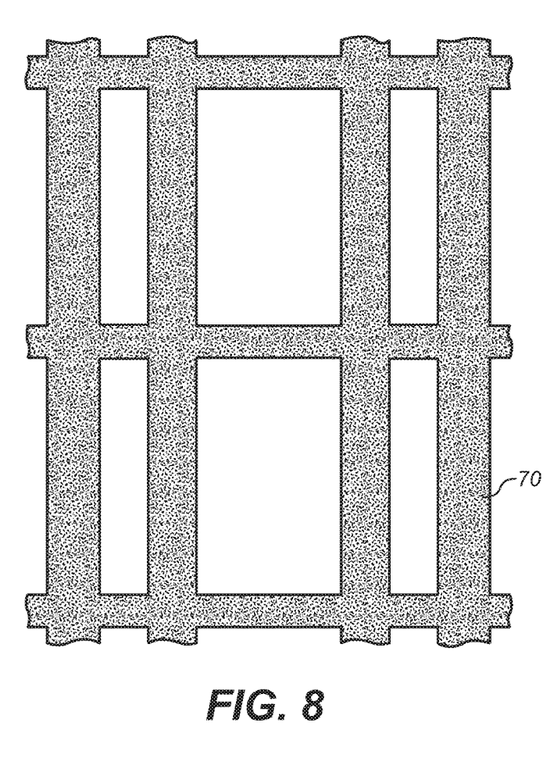
FIG. 8 is a top down view of a gate/trench configuration where gate/trench areas are removed to form passive cells in those areas.
Figure 9:
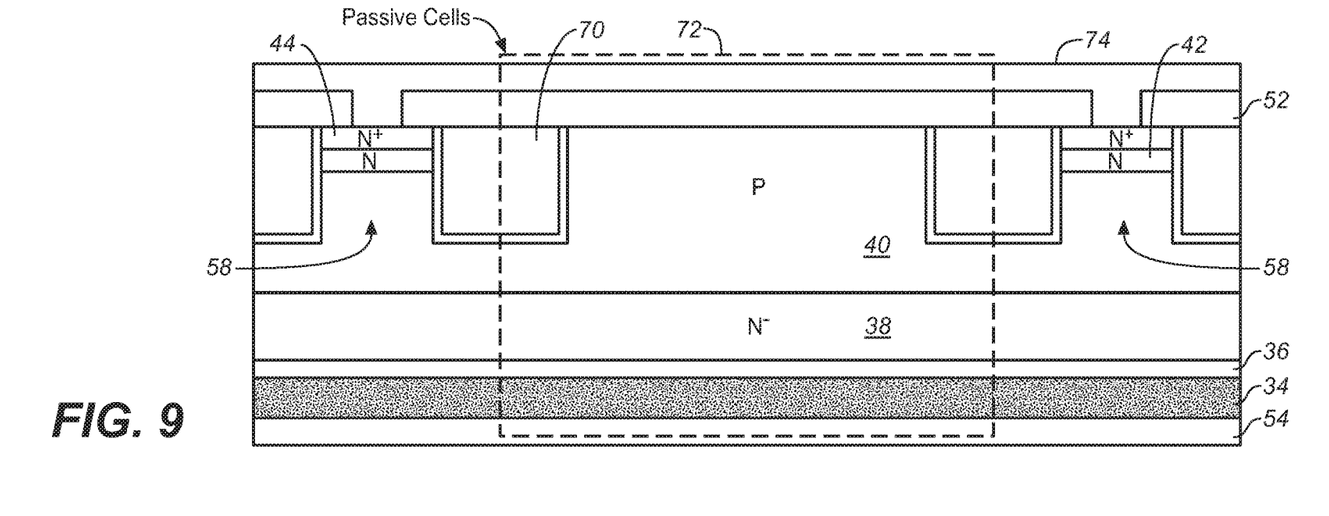
FIG. 9 is a cross-sectional view of a portion of an IGTO using the gate/trench configuration of FIG. 8 where no gates/trenches are formed in passive cells.

FIG. 8 is a top down view of the gates 70 configuration in one embodiment, and FIG. 9 shows the IGTO with the gates 70. The gates 70 correspond to the etched trenches. Sections of the gate mesh (and associated trenches) are effectively removed without affecting the active cell design. Removal of these gate sections reduces the amount of gate per unit area, which proportionally reduces the input capacitance. No N+ regions 44 are formed in the passive cells 72, so there is no current flow in the passive cells. The saturation current is also reduced, as previously described, with no significant increase in the ON voltage. The N+ regions 44 in the active cells 58 are connected to the source electrode 74.

Effect on IGTO Capacitance

The capacitances of each of these modified IGTO structures will be reduced, but the specific amount depends on the initial structure as well as the specific implementation. However, this reduction should be on the order of the ratio of passive cells to total cells. Further reductions in capacitance values may be obtained by other means such as increasing the thickness of the gate oxide layer.

Effect on IGTO Saturation Current

Using any of the inventive structures will typically reduce the IGTO saturation current in ways that are determined by simulation. The additional use of a thicker gate oxide layer will further reduce the saturation current.

IGTO Process Variations

The IGTO structures disclosed include an N-type region 42 below the N+ region 44 in the upper region of each device. In some variations of the IGTO, this N-type region 42 is required, while in other structures, it is not required. In the present IGTO examples, the N-type region 42 is not required.

OTHER EXAMPLES

Figure 10:
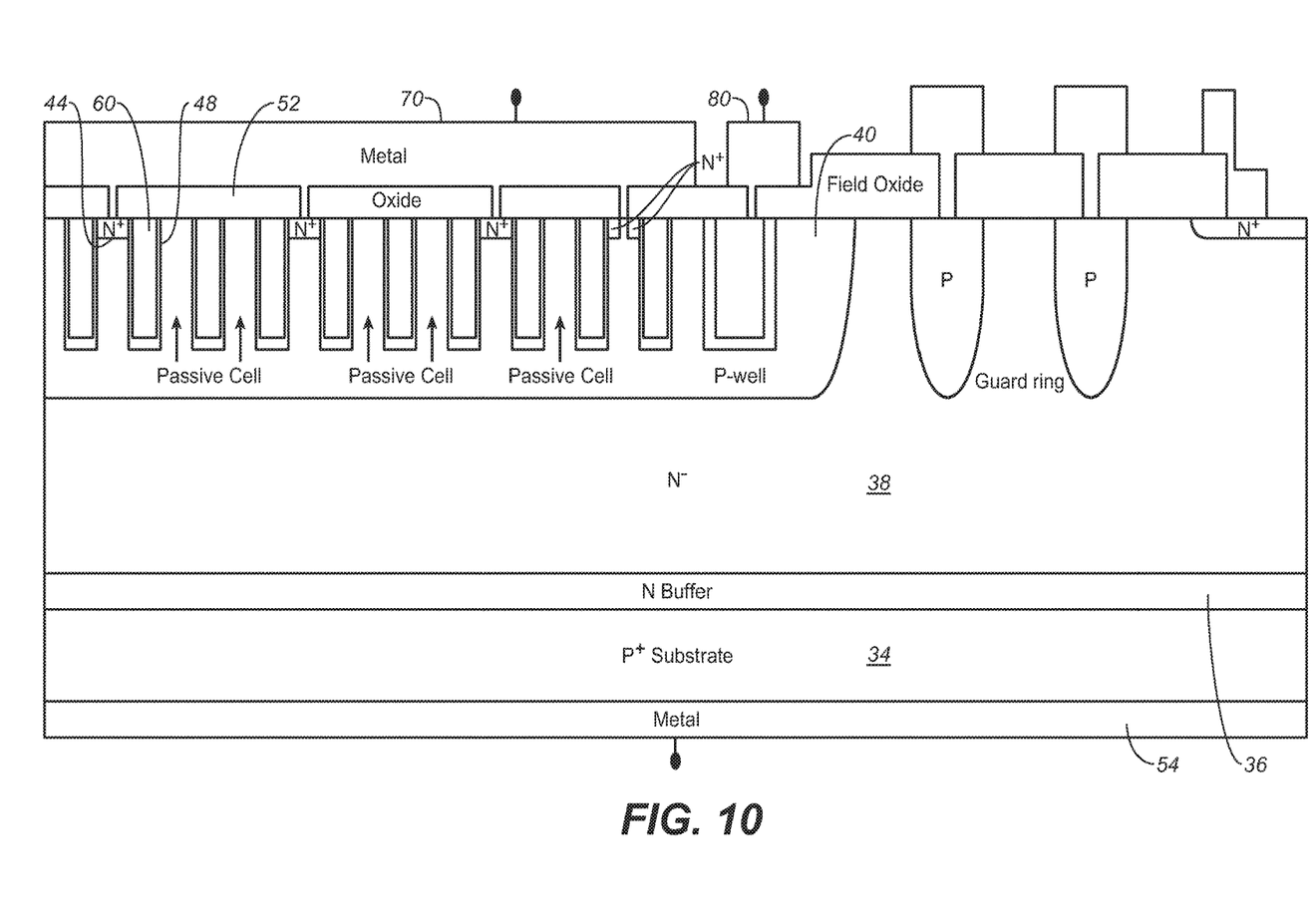
FIG. 10 is a cross-sectional view of a portion of an IGTO similar to FIG. 7 where the ratio of passive cells to active cells is about 2:1. Any ratio is envisioned as long as other device parameters, such as breakdown voltage, are not adversely affected.
Figure 11:
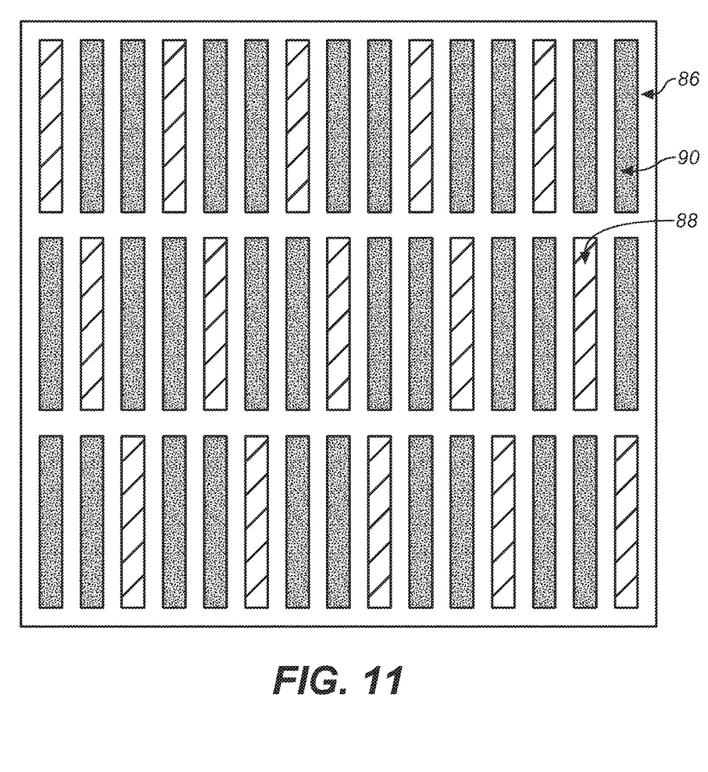
FIG. 11 is a top down view of the gate/trench configuration of FIG. 10 showing the locations of the passive and active cells.
Figure 12:
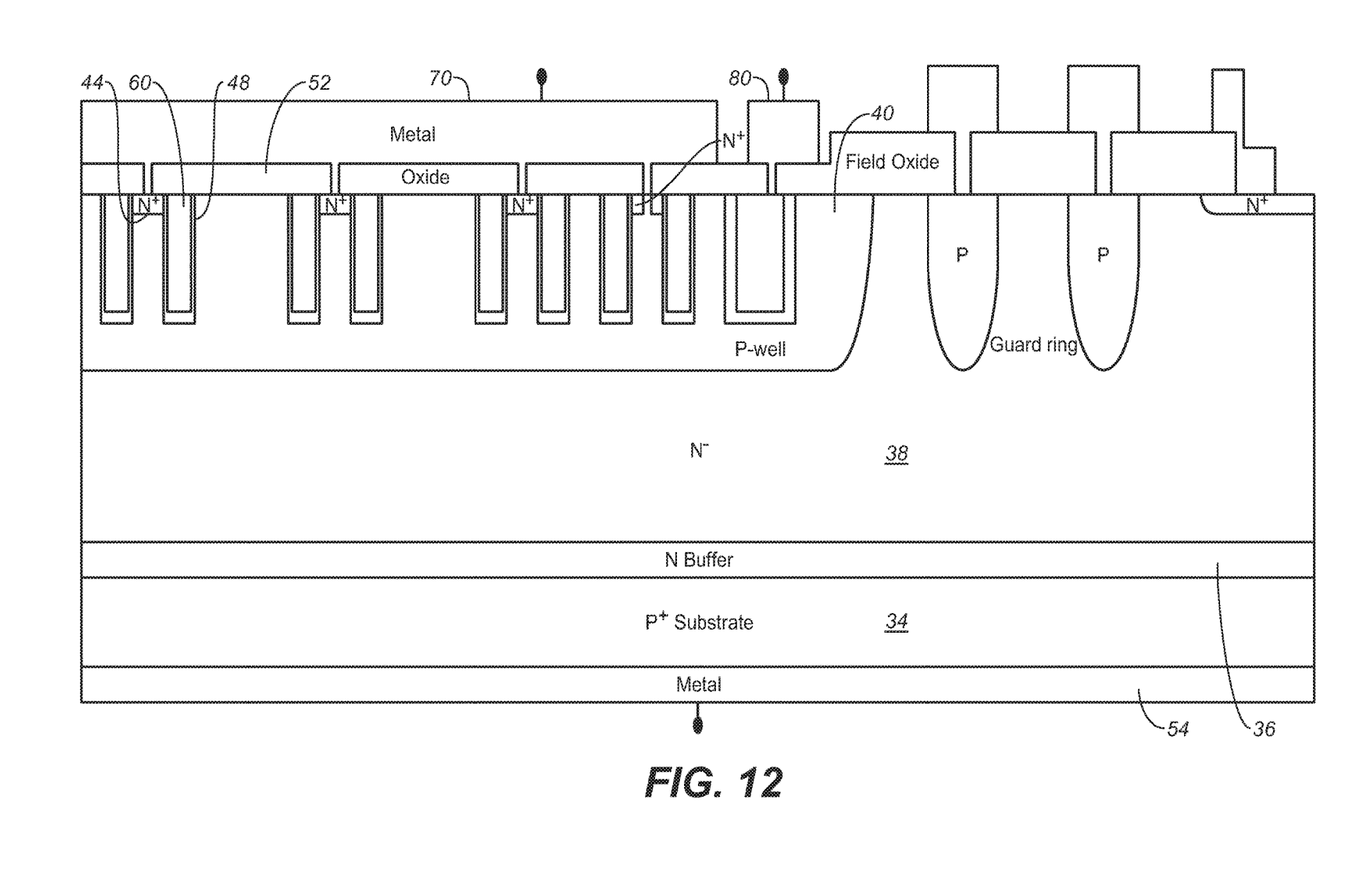
FIG. 12 is a cross-sectional view of a portion of an IGTO similar to FIG. 10 but where the gate/trench configuration does not form a uniform array when creating the passive and active cells.

FIGS. 10-12 are other examples of IGTOs using the techniques described herein. FIGS. 10 and 12 show the IGTO structure near an edge of the die. The locations of the passive cells do not need to be uniform over the die but may be located to tailor the current to maximize performance, such as by reducing the current near the edge of the die.

FIG. 10 illustrates an embodiment similar to FIG. 7, where the gates 60 are uniform and all coupled to the gate electrode 80. Some cells are made passive by not including the N+ region 44. The P-well 40 is not connected to the source electrode 70 in the passive cells. Note that the source electrode 70 is weakly connected to the P-well 40 near the edge of the P-well 40 by opening up the N+ region 44 in that cell.

FIG. 11 is a top down view of one possible gate configuration showing the polysilicon gate mesh 86 and the locations of the active cells 88 and passive cells 90. The gates are all connected together. Note that the ratio of passive cells 90 to active cells 88 is about 2:1. Other ratios are envisioned, such as about 1:1 or less. In some cases, the locations of the gates/trenches for the active and passive cells form a uniform array of gates/trenches for more uniform current distribution.

FIG. 12 shows an example of where the gates/trenches do not form a uniform array. As in FIG. 11, the passive cells are formed by eliminating the N+ regions 44 in a cell.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:
   a first semiconductor layer of a first conductivity type coupled to a first electrode;
   a second semiconductor layer of a second conductivity type overlying the first semiconductor layer;
   a third semiconductor layer of the first conductivity type overlying at least a portion of the second semiconductor layer;
   an array of cells, at least some of the cells being active cells, the active cells comprising:
     a plurality of first insulated gates within trenches not extending through the third semiconductor layer, the first insulated gates being electrically connected together;
     a first semiconductor region of the second conductivity type overlying the third semiconductor layer and adjacent to each of the first insulated gates, the first semiconductor region being connected to a second electrode, the second electrode being on a first side of the die, and the first electrode being on a second side of the die,
     wherein the active cells conduct a current when the IGTO device is forward biased and the first insulated gates are biased above a threshold voltage;
   at least some of the cells in the array of cells being passive cells distributed among the active cells, the passive cells comprising:
     a plurality of second insulated gates within trenches not extending through the third semiconductor layer,
     wherein the passive cells do not conduct a current when the IGTO device is forward biased and the first insulated gates are biased above the threshold voltage.

2. The device of claim 1 wherein the passive cells do not contain the first semiconductor region adjacent to the second insulated gates.

3. The device of claim 2 wherein the second insulated gates are electrically connected to the first insulated gates.

4. The device of claim 2 wherein the second electrode is electrically connected to a surface of the third semiconductor layer within the passive cells.

5. The device of claim 2 wherein the second electrode is electrically insulated from a surface of the third semiconductor layer within the passive cells.

6. The device of claim 1 wherein the second insulated gates are electrically insulated from the first insulated gates.

7. The device of claim 6 wherein the second insulated gates are electrically connected to the second electrode.

8. The device of claim 6 wherein the second insulated gates are electrically floating.

9. The device of claim 6 wherein each second insulated gate is surrounded by the first insulated gates.

10. The device of claim 9 wherein the second insulated gates are electrically connected to the second electrode.

11. The device of claim 9 wherein the second insulated gates are electrically floating.

12. The device of claim 1 wherein a ratio of passive cells to active cells is less than 2:1.

13. The device of claim 1 wherein the passive cells comprise groups of adjacent passive cells.

14. The device of claim 1 wherein the passive cells comprise groups of adjacent passive cells.

15. The device of claim 1 wherein the passive cells are wider than the active cells.

16. The device of claim 1 wherein the first semiconductor layer is P-type, wherein the second semiconductor layer is N-type, wherein the third semiconductor layer is P-type, and wherein the first semiconductor region is N-type,
   wherein the third semiconductor layer, second semiconductor layer, and first semiconductor layer form a vertical PNP bipolar transistor,
   wherein the second semiconductor layer, third semiconductor layer, and first semiconductor region form a vertical NPN bipolar transistor,
   wherein, when the first insulated gates are biased below the threshold voltage, a product of a betas of the NPN and PNP bipolar transistors is less than one,
   wherein, when the first insulated gates are biased above the threshold voltage, a product of a betas of the NPN and PNP bipolar transistors is greater than one to turn on the device.

17. The device of claim 1 wherein a ratio of passive cells to active cells is selected to achieve a particular input capacitance.

18. The device of claim 1 wherein a ratio of passive cells to active cells is selected to achieve a particular saturation current.

19. An insulated gate turn-off (IGTO) device formed as a die comprising:
   a first semiconductor layer of a first conductivity type coupled to a first electrode;
   a second semiconductor layer of a second conductivity type overlying the first semiconductor layer;
   a third semiconductor layer of the first conductivity type overlying at least a portion of the second semiconductor layer;
   an array of cells comprising:
     a plurality of insulated gates within trenches not extending through the third semiconductor layer, the insulated gates being electrically connected together, the insulated gates forming a conductive mesh having first openings and second openings when viewed from a top of the device;
     a first semiconductor region of the second conductivity type overlying the third semiconductor layer and adjacent to at least one side of each of the insulated gates, the first semiconductor region being connected to a second electrode, the second electrode being on a first side of the die, and the first electrode being on a second side of the die,
     wherein the cells conduct a current when the IGTO device is forward biased and the insulated gates are biased above a threshold voltage,
     wherein at least a first subset of the insulated gates has the first semiconductor region adjacent to the insulated gates in the first subset only within the first openings of the mesh to form active cells within the first openings that conduct current, and wherein first subset of the insulated gates have the first semiconductor region not adjacent to the insulated gates in the first subset within the second openings of the mesh to form passive cells within the second openings that do not conduct current.

20. The device of claim 19 wherein the second openings are larger than the first openings such that the passive cells are larger than the active cells.

* * * * *